(12) United States Patent
Fork et al.

(10) Patent No.: US 6,560,861 B2
(45) Date of Patent: May 13, 2003

(54) MICROSPRING WITH CONDUCTIVE COATING DEPOSITED ON TIP AFTER RELEASE

(75) Inventors: David K. Fork, Los Altos, CA (US); Christopher Chua, San Jose, CA (US)

(73) Assignee: Xerox Corporation, Stamford, CT (US)

( * ) Notice: Subject to any disclaimer, the term of this patent is extended or adjusted under 35 U.S.C. 154(b) by 56 days.

(21) Appl. No.: 09/904,370

(22) Filed: Jul. 11, 2001

(65) Prior Publication Data

US 2003/0010615 A1 Jan. 16, 2003

(51) Int. Cl.[7] ................................................. H05K 3/00
(52) U.S. Cl. .............................. 29/842; 29/874; 29/876
(58) Field of Search ........................ 29/842, 874, 876, 29/882

(56) References Cited

U.S. PATENT DOCUMENTS 3,842,189 A 10/1974 Southgate
5,613,861 A 3/1997 Smith et al.
6,117,694 A * 9/2000 Smith et al.
6,184,699 B1 * 2/2001 Smith et al.
6,264,477 B1 * 7/2001 Smith et al.

* cited by examiner

Primary Examiner—Carl J. Arbes
(74) Attorney, Agent, or Firm—Bever, Hoffman & Harms, LLP; Patrick T. Bever

(57) ABSTRACT

Efficient methods are disclosed for fabricating spring structures in which a passive, conductive coating is deposited onto the spring structure after release. A release layer is deposited on a substrate and then a spring metal layer is formed thereon. A first mask is then used to etch the spring metal layer to form a spring metal finger. A second (release) mask is then deposited that defines a release window used to remove a portion of the release layer and release a free end of the spring metal finger. The second mask is also used as a mask during the subsequent directional deposition of a conductive coating material on the cantilevered tip of the finger. The second mask is then stripped, and the residual coating deposited thereon is lifted off. The resulting spring structure includes conductive coating on the upper surface and front edge of the finger tip.

12 Claims, 3 Drawing Sheets

MICROSPRING WITH CONDUCTIVE COATING DEPOSITED ON TIP AFTER RELEASE

FIELD OF THE INVENTION

This invention generally relates to stress-engineered metal films, and more particularly to photo lithographically patterned micro-spring structures formed from stress-engineered metal films.

BACKGROUND OF THE INVENTION

Photo lithographically patterned spring structures (sometimes referred to as "microsprings") have been developed, for example, to produce low cost probe cards, and to provide electrical connections between integrated circuits. A typical microspring includes a spring metal finger having an anchor portion secured to a substrate, and a free (cantilevered) portion extending from the anchored portion over the substrate. The spring metal finger is formed from a stress-engineered metal film (i.e., a metal film fabricated such that its lower portions have a higher internal compressive stress than its upper portions) that is at least partially formed on a release material layer. The free portion of the spring metal finger bends away from the substrate when the release material located under the free portion is etched away. The internal stress gradient is produced in the spring metal by layering different metals having the desired stress characteristics, or using a single metal by altering the fabrication parameters. Such spring metal structures may be used in probe cards, for electrically bonding integrated circuits, circuit boards, and electrode arrays, and for producing other devices such as inductors, variable capacitors, and actuated mirrors. For example, when utilized in a probe card application, the tip of the free portion is brought into contact with a contact pad formed on an integrated circuit, and signals are passed between the integrated circuit and test equipment via the probe card (i.e., using the spring metal structure as a conductor). Other examples of such spring structures are disclosed in U.S. Pat. No. 3,842,189 (Southgate) and U.S. Pat. No. 5,613,861 (Smith).

The present inventors have observed that conventional spring structures develop contact resistances that are detrimental to signal transmissions when the spring structures are used as conductors. The spring metal (e.g., Mo, MoCr, NiZr) is typically chosen for its ability to retain large amounts of internal stress. These materials typically oxidize in air, a phenomenon that can interfere with their ability to make electrical contact, for example, with the contact pad of an integrated circuit when used in a probe card. The spring metal materials can also gall to the contact pad, which is typically aluminum. Once the galled aluminum oxidizes, the contact resistance between the contact pad and the spring metal structure increases. One proposed approach to reducing contact resistance is to passivate the spring metal before etching and release. However, the passivating material tends to resist bending of the spring metal finger after release, and provides minimal coverage along the front edge at the tip, thereby allowing direct contact with the spring metal that can result in increased contact resistance.

What is needed is a spring metal structure that resists increased contact resistance by avoiding oxidation of the spring metal and/or galling of a contact pad against which the spring metal structure is pressed.

SUMMARY OF THE INVENTION

The present invention is directed to efficient methods for fabricating microspring structures in which a conductive coating is deposited on the tip of the free (i.e., cantilevered) portion of the spring metal finger using a directional deposition process after release from an underlying substrate. By directing the spring coating deposition on the spring metal finger tip after release (i.e. after the finger is allowed to bend upward from the substrate due to internal stress), the conductive coating is reliably formed on the front edge and upper surface of the spring metal finger tip without impeding the bending process, thereby producing a low-cost spring structure with reduced contact resistance when compared to non-coated spring structures, or to spring structures coated before release.

In accordance with the disclosed method, a conductive release layer is deposited on a substrate, and then a stress-engineered (spring) metal film is formed on the release material layer. A first mask is then used to etch an elongated spring metal island from the metal film, but etching is stopped before the release layer is entirely removed to prevent undercutting that can cause premature release of the spring metal island. A release (second) mask is then deposited that defines a release window exposing a portion of the spring metal island and the release material layer surrounding this exposed portion. In accordance with an aspect of the invention, the release window is formed with an overhang that helps prevent overlapping of coating material, thereby facilitating lift-off of the residual coating formed on the release mask. Subsequent removal of the release material exposed by the release mask causes the exposed portion of the spring metal island to bend away from the substrate due to its internal stress, thereby becoming the free portion of a spring metal finger (an anchored portion of the spring metal finger remains covered by the release mask). The release mask is then used as a mask during the deposition of the conductive coating (e.g., a refractory noble metal such as Rhodium (Rh), Iridium (Ir), Rhenium (Re), Platinum (Pt), and Palladium (Pd)) on the tip and other exposed portions of the spring metal finger. The overhanging release mask structure prevents overlapping of the coating material to facilitate lift-off of residual coating portions during the subsequent removal of the release mask.

In another embodiment, the release mask, which is also used during the deposition process, is provided with a channel extending over the anchored (i.e., non-released) portion of the spring metal finger, thereby facilitating the formation of conductive coating portions on the anchor portion of the spring metal finger to improve conductivity.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
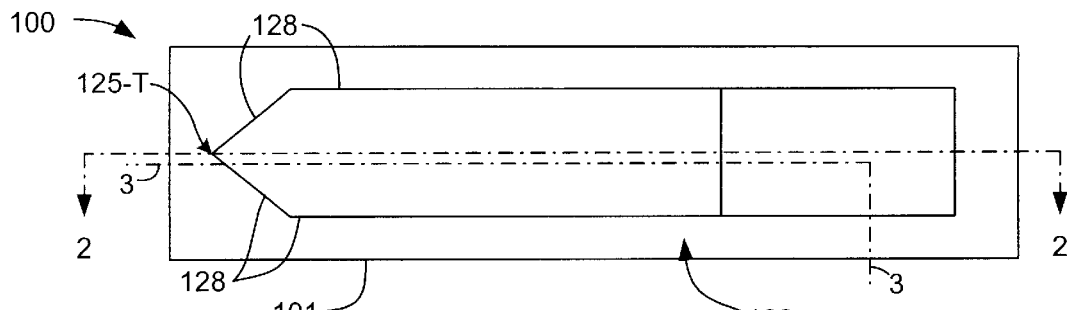
FIG. 1 is a plan view showing a spring structure according to a first embodiment of the present invention.
Figure 2:
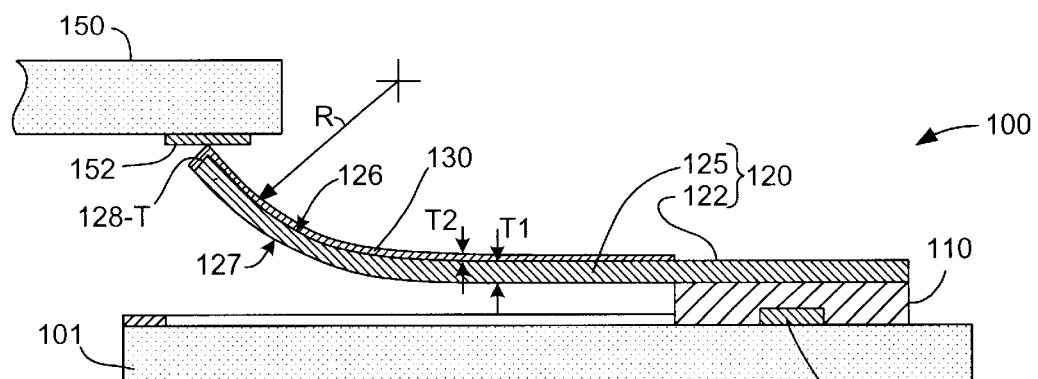
FIG. 2 is a cross-sectional side view of the spring structure taken along section line 2—2 of FIG. 1, and the spring structure contacting a separate integrated circuit.
Figure 3:
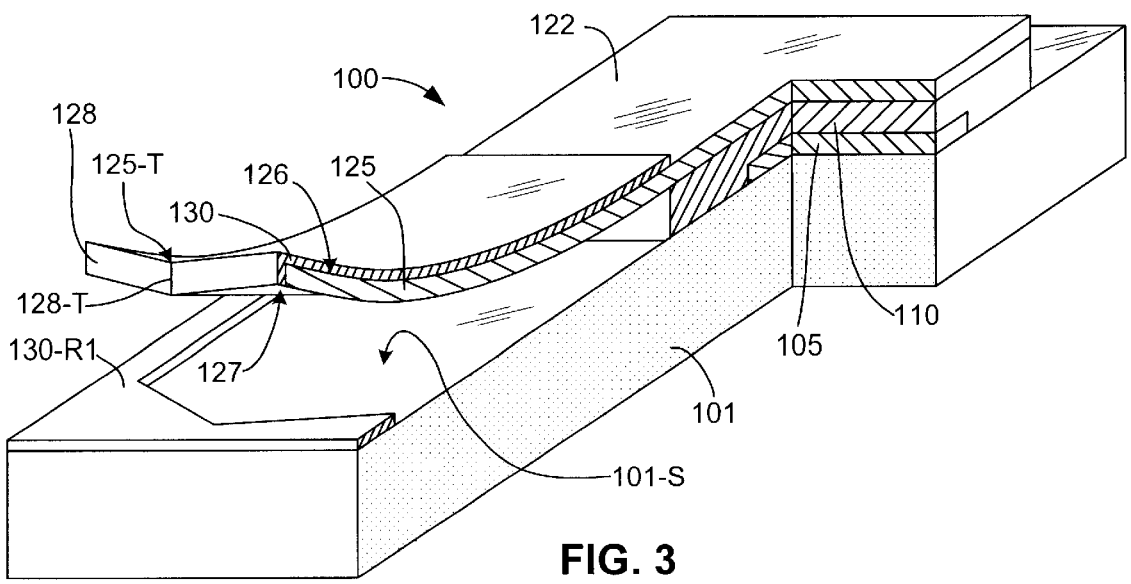
FIG. 3 is a cut-away perspective view of the spring structure shown in FIG. 1.

FIGS. 1, 2 and 3 show a spring structure 100 according to a first embodiment of the present invention. FIG. 1 is a plan view of spring structure 100, FIG. 2 is a cross-sectional side view taken along section line 2—2 of FIG. 1, and FIG. 3 is a perspective view with a cut-away section indicated by section line 3—3 in FIG. 1.

Spring structure 100 generally includes a substrate 101, a release material portion 110, and a spring metal finger 120. Substrate 101 (e.g., glass) includes an optional conductor 105 that can take several forms (i.e., a metal trace deposited on the substrate, as shown, or a buried conductor accessed by an opening in a passivation layer (not shown)). When present, conductor 105 may provide electrical connection between electronic components of an integrated circuit and spring structure 100. Alternatively, if substrate 101 is printed circuit board, printed wiring board, silicon device, or interposer, then conductor 105 may be an exposed portion of conducting material that is electrically connected to redistribution traces, through substrate vias, solder bumps, solder balls, mounted electrical components, integrated passive components, or interconnect pads. Release material portion 110 is formed on an upper surface of substrate 101 such that it contacts conductor 105 (if present). Spring metal finger 120 includes an anchor portion 122 and a free (i.e., cantilevered) portion 125. Anchor portion 122 is attached to release material portion 110 (i.e., such that release material portion 110 is located between anchor portion 122 and substrate 101). Free portion 125, which includes a tip 125-T, extends from anchor portion 122 over substrate 101, and includes an upper (first) surface 126 and an opposing lower (second) surface 127 that define a thickness T1 in the range of 0.1 and 10 microns (see FIG. 2). Note that edges 128 of free portion 125 extend between upper surface 126 and lower surface 127.

Similar to prior art spring structures, spring metal finger 120 is etched from a stress-engineered metal film that is formed by DC magnetron sputtering one or more metals using gas (e.g., Argon) pressure variations in the sputter environment during film growth in accordance with known techniques. By carefully selecting the metals and/or processing parameters, sputtered metal films can be used to form tightly curved spring metal fingers, or very stiff spring metal fingers, but not both simultaneously because increasing the film thickness (which is necessary to increase stiffness) also increases the radius of the resulting spring metal finger. Further, the internal stress of the stress-engineered metal film cannot be increased arbitrarily because of material limitations.

In accordance with an aspect of the present invention, electrically conductive coating 130 is formed to minimize contact resistance between spring metal finger 120 and contact structure (e.g., a contact pad 152 formed on a separate integrated circuit 150, as shown in FIG. 2). In one embodiment, conductive coating 130 includes one or more of the refractory noble metals (e.g., Rhodium (Rh), Iridium (Ir), Rhenium (Re), Platinum (Pt), and Palladium (Pd)) having a thickness T2 in the range of 0.1 and 3 microns (see FIG. 2). To minimize contact resistance, conductive coating 130 is deposited on free portion 125 of spring metal finger 120 after free portion 125 is released (i.e., after release material located under free portion 125 is removed, thereby allowing internal stress to bend free portion 125 away from substrate 101). Because conductive coating 130 is formed after free portion 125 is released, conductive coating 130 is deposited on upper surface 126 and edges 128 of free portion 125, and in particular on front edge 128-T located at tip 128. Accordingly, as shown in FIG. 2, spring structure 100 contacts external integrated circuit 150 through conductive coating 130, thereby preventing increased contact resistance due to oxidation of spring metal finger 120 or galling of contact pad 152. Several additional benefits provided by conductive coating 130 are described in the following paragraphs.

First, forming conductive coating 130 after release allows spring structure 100 to be relatively thick (and, therefore, stiff), thereby increasing the spring force constant of spring structure 100 at a lower cost than non-coated spring structures, or spring structures having conductive coating formed only on one side. As indicated in FIG. 2, the deposition process increases a total thickness of free portion 125 by the thickness T2 of conductive coating 130. As described below, conductive coating 130 is formed at very low cost because the basic two-mask process utilized for making non-coated spring structures is not violated (i.e., no additional masks are used to perform the coating deposition process).

Second, forming conductive coating 130 after release allows spring structure 100 to be both tightly curved and relatively thick (and, therefore, stiff) at a lower cost than non-coated spring structures, or spring structures having conductive coating formed only on one side. As indicated in FIG. 2 and discussed above, the curvature R of free portion 125 is partially determined by the thickness T1 of the stress-engineered metal film from which it is etched. In order to generate a tightly curved spring structure, a relatively thin metal film is required. According to the present invention, spring structure 100 can be both tightly curved and relatively thick by forming spring metal finger 120 from a thin stress-engineered metal film, and then forming a relatively thick of conductive coating 130.

Third, conductive coating 130 passivates spring metal finger 120, which is important because most springy metals, such as stress-engineered metal film, form surface oxides. Conductive coating 130 also increases wear resistance and lubricity, and thereby resists the galling of an associated contact structure (e.g., contact pad 152, which is shown in FIG. 2). Conductive coating 130 can also provide a compression stop to limit spring compression. Moreover, conductive coating 130 may be added to strengthen spring structure 100 by adding ductility. Finally, conductive coating 130 may be added to blunt the radii of process features and defects that can arise on spring metal finger 120. The above-mentioned benefits are not intended to be exhaustive.

Note that optional conductor 105 is included to provide electrical coupling of spring structure 100 to an external electrical system (not shown). Note also that the electrical coupling between spring metal finger 120 and conductor 105 necessitates using an electrically conductive release material to form release material portion 110. However, electrical coupling can also be provided directly to spring metal finger 120 by other structures (e.g., wire bonding, or pre-patterning the release layer), thereby allowing the use of non-conducting release materials. Further, the cost-to-thickness (stiffness) characteristics discussed above may also be beneficially exploited in applications in which spring metal finger 120 is not used to conduct electric signals.

FIGS. 4(A) through 4(J) and FIGS. 5(A) and 5(B) illustrate a method for fabricating spring structure 100 (described above).

Figure 4A:
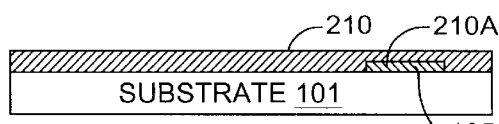
FIGS. 4(A) through 4(J) are cross-sectional side views showing fabrication steps associated with the production of the spring structure shown in FIG. 1.

Referring to FIG. 4(A), the fabrication method begins with the formation of a conductive release material layer 210 over a glass (silicon) substrate 101. In one embodiment, release material layer 210 is formed from an electrically conductive material, and a portion 210A of release material layer 210 contacts a conductor 105 that is exposed on the upper surface of substrate 101. In one embodiment, release material layer 210 is Titanium (Ti) that is sputter deposited onto substrate 101 to a thickness of approximately 0.2 microns or greater. Titanium provides desirable characteristics as a conductive release material layer due to its plasticity (i.e., its resistance to cracking) and its strong adhesion. Other release materials having the beneficial plastic characteristics of titanium may also be used. In other embodiments, release material layer 210 includes another metal, such as Copper (Cu), Aluminum (Al), Nickel (Ni), Zirconium (Zr), or Cobalt (Co). Release material layer 210 may also be formed using heavily doped silicon (Si). Further, two or more release material layers can be sequentially deposited to form a multi-layer structure. In yet another possible embodiment, any of the above-mentioned release materials can be sandwiched between two non-release material layers (i.e., materials that are not removed during the spring metal release process, described below). Alternatively, when it is not necessary to provide electrical conduction between the subsequently deposited spring metal layer and a contact pad (such as conductor 105), release material layer 210 can be a non-conducting material such as Silicon Nitride (SiN).

Figure 4B:
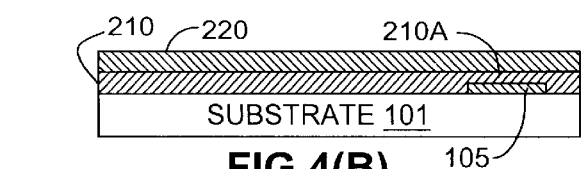

FIG. 4(B) shows a stress-engineered metal film 220 formed on release material layer 210 using known processing techniques such that it includes internal stress variations in the growth direction. For example, in one embodiment, stress-engineered metal film 220 is formed such that its lowermost portions (i.e., adjacent to release material layer 210) has a higher internal compressive stress than its upper portions, thereby causing stress-engineered metal film 220 to have internal stress variations that cause a spring metal finger to bend upward away from substrate 101 (discussed below). Methods for generating such internal stress variations in stress-engineered metal film 220 are taught, for example, in U.S. Pat. No. 3,842,189 (depositing two metals having different internal stresses) and U.S. Pat. No. 5,613, 861 (e.g., single metal sputtered while varying process parameters), both of which being incorporated herein by reference. In one embodiment, which utilizes a 0.2 micron Ti release material layer, stress-engineered metal film 220 includes Molybdenum and Chromium (MoCr) sputter deposited to a thickness of 1 micron. In other embodiments, a Mo spring metal layer can be formed on SiN release material layers.

Note that when conductive release material is used, stress-engineered metal film 220 is separated from conductor 105 by portion 210A of release material layer 210. Accordingly, a separate masking step utilized in conventional fabrication methods to form an opening in the release material is not required, thereby reducing fabrication costs. Instead, as discussed below, the present embodiment utilizes the conductivity of release material layer 210 to provide electrical connection between. conductor 105 and stress-engineered metal film 220.

Figure 4C:
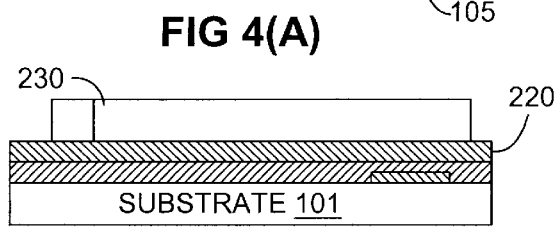
Figure 5A:
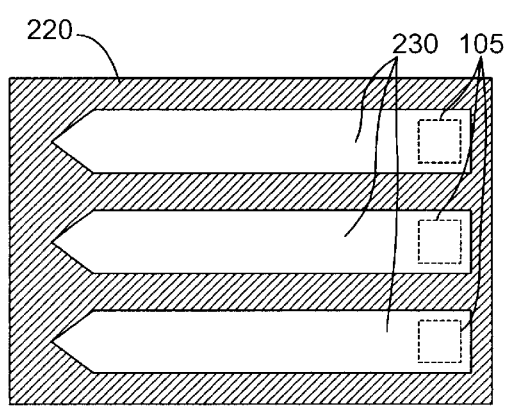
FIGS. 5(A) and 5(B) are plan views showing the spring structure of FIG. 1 during selected fabrication steps.

Referring to FIGS. 4(C) and 5(A), elongated spring metal (first) masks 230 (e.g., photoresist) are then patterned over a selected portion of stress-engineered metal film 220. Note that each spring metal mask 230 extends over an associated conductor 105 (if present), as shown in FIG. 5(A).

Figure 4D:
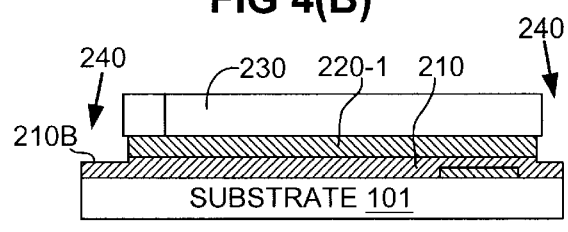

Next, as indicated in FIG. 4(D), exposed portions of stress-engineered metal film 220 surrounding the spring metal mask 230 are etched using one or more etchants 240 to form a spring metal island 220-1. Note that this etching process is performed such that limited etching is performed in portions 210B of release layer 210 that surround spring metal island 220-1 such that at least a partial thickness of release layer portion 210B remains on substrate 101 after this etching step. In one embodiment, the etching step may be performed using, for example, a wet etching process to remove exposed portions of stress-engineered metal film 220. This embodiment was successfully performed using cerric ammonium nitrate solution to remove a MoCr spring metal layer. In another embodiment, anisotropic dry etching is used to etch both stress-engineered metal film 220 and the upper surface of release layer portion 210B. This embodiment may be performed, for example, with Mo spring metal, and Si or Ti release layers. Mo, Si and Ti all etch in reactive fluorine plasmas. An advantage of dry etching the spring metal film is that it facilitates finer features and sharper tipped spring metal fingers. Materials that do not etch in reactive plasmas may still be etched anisotropically by physical ion etching methods, such as Argon ion milling. In yet another possible embodiment, the etching step can be performed using the electrochemical etching process described in IBM J. Res. Dev. Vol. 42, No. 5, page 655 (Sep. 5, 1998), which is incorporated herein by reference. Many additional process variations and material substitutions are therefore possible and the examples given are not intended to be limiting.

Figure 4E:
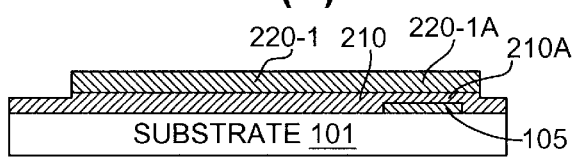

FIG. 4(E) shows spring metal island 220-1 and release material 210 after spring metal mask 230 (FIG. 4(D)) is removed. Note again that electrical connection between conductor 105 and spring metal island 220-1 is provided through portion 210A of release material layer 210.

Figure 4F:
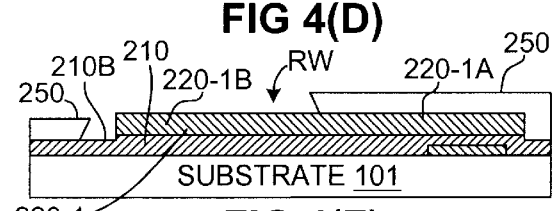

Referring to FIG. 4(F), release (second) mask 250 (e.g., photoresist) is then formed on a first portion 220-1A of spring metal island 220-1. Release mask 250 defines a release window RW, which exposes a second portion 220-1B of spring metal island 220-1 and surrounding portions 210B of release material layer 210. In one embodiment, release mask 250 is intentionally formed with a negative sloped side wall (for example, using negative resist or image reversal techniques) to facilitate the liftoff of the conductive coating deposited thereon, as discussed below.

Figure 5B:
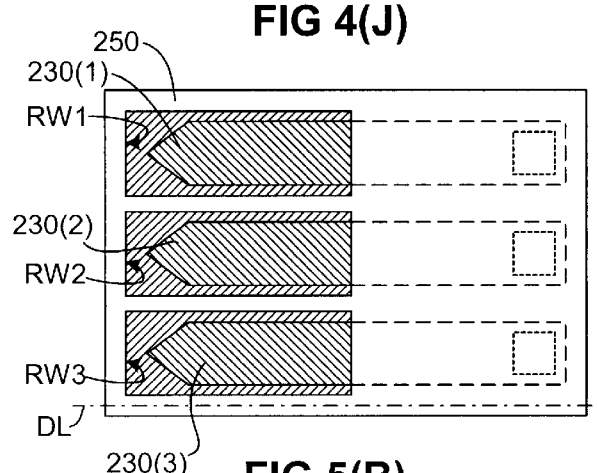

Referring to FIG. 5(B), note that release mask 250 is formed such that each spring metal island 230(1) through 230(3) formed on substrate 101 is exposed through a separate release window RW1 through RW3, respectively. Separate release windows are provided for each spring structure because the release window will also define the pattern of the subsequently deposited conductive coating. That is, if two or more spring structures were exposed through the same window, then conductive coating would be deposited on substrate 101 separating the two spring structures, which would require an additional etching mask to remove the residual coating. Accordingly, by providing separate release windows for each spring structure, the total number of required masks is minimized. Note, however, that separate release windows result in greater spacing between spring structures to facilitate the formation of the release mask wall separating the release windows. That is, providing space for these release mask walls implies in principle that the spring structures need to be further apart.

FIG. 5(B) also indicates an optional dice line DL that extend along the resist mask walls located between spring metal island 230(3) and an adjacent group of spring structures (not shown). Typically, substrate 101 is diced between the formation of release window 250 and the lifting of the springs (discussed below). According to the present invention, batch processing spring structures is facilitated in that all of the masking is done before dicing (i.e., because no further masks are required to deposit and/or etch the conductive coating), thereby permitting a substantial reduction in total production costs in comparison to production processes, for example, in which the lifted and coated spring metal fingers are dipped into a masking material.

Figure 4G:
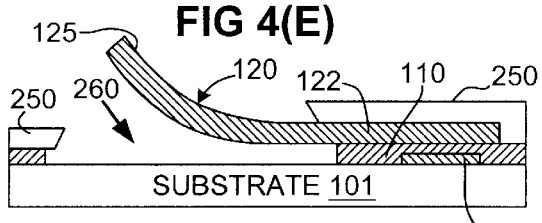

Referring to FIG. 4(G), a release etchant 260 (e.g., a buffered oxide etch) is then use to selectively remove a portion of the release material layer from beneath the exposed portion of the spring metal island to form spring metal finger 120 (discussed above with reference to FIGS. 1–3). Specifically, removal of the exposed release material causes free portion 125 to bend away from substrate 101 due to the internal stress variations established during the formation of the spring metal film (discussed above). Note that anchor portion 122 remains secured to substrate 101 by release material portion 110, which is protected by release mask 250. Note also that when release material portion 110 is formed from a conductive release material, the resulting spring structure is electrically coupled to conductor 105.

Figure 4H:
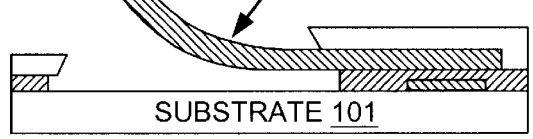

FIG. 4(H) depicts an optional step for in-situ milling or back sputtering 270 that prepares the metal surfaces of free portion 125 for optimal adherence of the subsequently applied coating using known techniques.

Figure 4I:
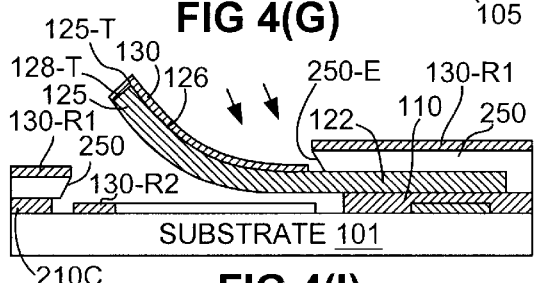

FIG. 4(I) shows the deposition of conductive coating 130 on free portion 125 after release. According to an aspect of the present invention, this deposition step is performed using a directional deposition source (e.g., using line-of-sight material flux from a small area source, such as electron beam evaporation or sputter deposition using a material collimator). Note that by performing the deposition of conductive coating 130 after free portion 125 is lifted, top surface 126 and front edge 128-T located at tip 125-T of free portion 125 face into the deposition to facilitate uniform coating. Further, because the directional deposition facilitates the formation of conductive coating 130 on front edge 128-T of free portion 125 after it is lifted, better coverage of tip 125-T is achieved than if deposition is performed before release. Further, deposition of conductive coating 130 before the release process runs the risk that the deposited coating will overlay the release layer, and prevent or impede the flow of release etchant 260 under free portion 125 (see FIG. 4(G) for reference) of the spring structure.

FIG. 4(I) also shows the deposition of residual coating portions 130-R1 on release mask 250, and the deposition of residual coating portions 130-R2 on regions of substrate 101 that are exposed through the release window (i.e., adjacent to released free portion 125). Referring back to FIG. 3, note that residual coating portions 130-R2, which are not removed by subsequent removal of release mask 250, are not deposited on portions 101-S of substrate 101 that are shadowed by spring metal finger 125. Note that the negative-sloped side wall of release mask 250 produces an exposed edge 250-E between coating portion 130 and residual coating portion 130-R1 that allows access of a solvent during release mask etch (discussed below) to facilitate liftoff of residual coating portion 130-R1.

Figure 4J:
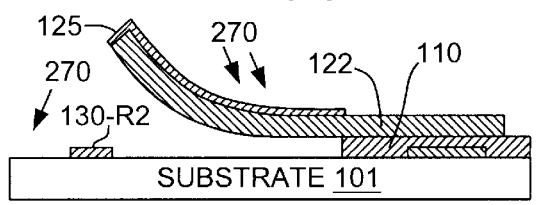

Finally, FIG. 4(J) shows spring structure 100 during the removal of release mask 250 and residual coating portions 130-R1 (see FIG. 4(I)). Referring briefly to FIG. 4(I), note that the negative-sloped side wall of release mask 250 produces an exposed edge 250-E between coating portion 130 and residual coating portion 130-R1. Returning to FIG. 4(J), this exposed edge allows access of a solvent 270 that dissolves release mask using known techniques. For example, when the release mask is image-reversed photoresist, acetone can be used as solvent 270. As the release mask is dissolved, residual coating portions formed thereon are lifted off. If necessary, agitation may be used to accelerate the lift-off process. Because these residual coating portions are lifted off during mask removal, there is no need to identify a selective etch for the coating material, which is typically difficult to etch chemically. Note, however, that residual coating portions 130-R2 remain on substrate 101 (see FIG. 3). However, because each spring structure 100 is formed in a separate release window (as shown in FIG. 5(B)), these residual coating portions remain isolated from adjacent conductive structures.

Figure 6:
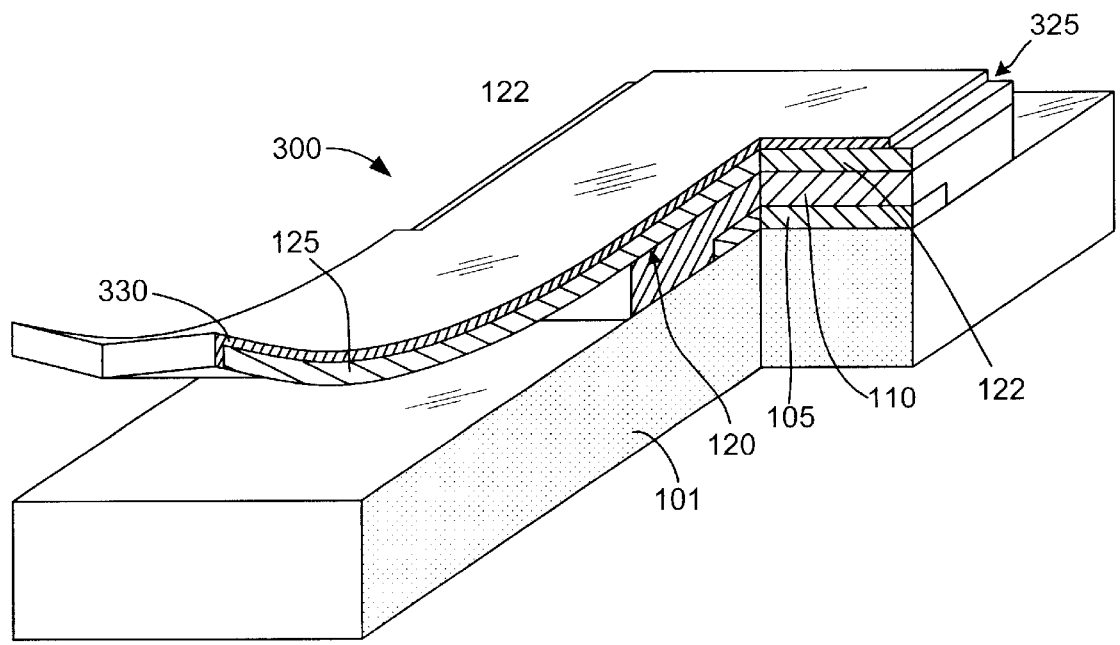
FIG. 6 is a cut-away perspective view showing a spring structure according to a second embodiment of the present invention.

FIG. 6 shows a spring structure 300 according to a second embodiment of the present invention. Similar to spring structure 100 (discussed above), spring structure 300 includes a release layer portion 110 formed on a conductor 105, a spring metal finger 120 formed on release layer portion 110, and a conductive coating 330 formed on spring metal finger 120. However, spring structure 300 differs from spring structure 100 in that conductive coating 330 is formed on both free portion 125 and anchored portion 122 of spring metal finger 120 (referring to FIG. 3, conductive coating 130 only covers free portion 125). Specifically, conductive coating 330 is formed on both sides of free portion 125, as described above, and is also formed on an upper surface of anchored portion 122. As mentioned above, it is well established that resilient springy metals such as MoCr exhibit relatively high resistance in comparison to many forms of conductive coating, such as Ni, Au and Cu. Accordingly, by extending conductive coating 330 over anchored portion 122, currents passing between free portion 125 and conductor 105 are subjected to less resistance than in spring structure 100 due to the presence of conductive coating 330 on anchor portion 122.

Figure 7:
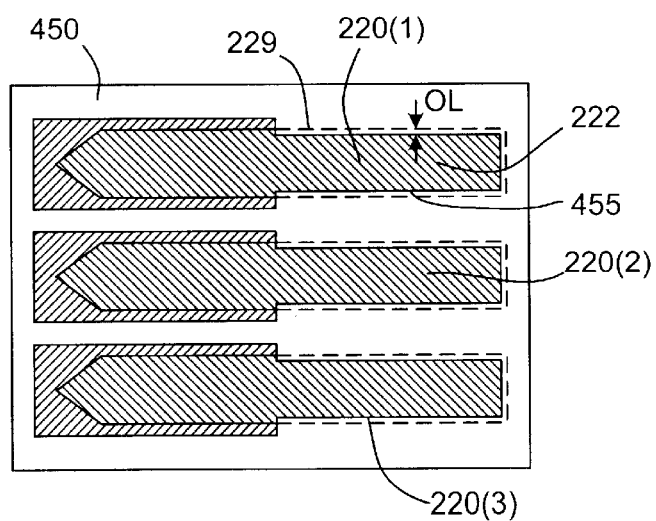
FIG. 7 is a plan view showing a release mask utilized to fabrication the spring structure shown in FIG. 6.

FIG. 7 is a plan view showing a release mask 450 utilized in the fabrication of spring structure 300 (FIG. 6). Release mask 450 is similar to release mask 250 (shown in FIG. 5(B)), except that the release window defined by release mask 450 exposes part of the anchored portion of each spring metal island 220(1) through 220(3). For example, referring to spring metal island 220(1), release window 450 includes a channel 455 that extends over anchored portion 222. Note that channel 455 overlaps the outer edge 229 of anchor portion 222 by an overlap width OL of 1 to 10 microns to prevent unintended release of anchor portion 222. Referring briefly to FIG. 6, this overlap produces a step structure shoulder 325 extending along the edge of anchor portion 122 after release, deposition, and removal of the release mask.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A method for fabricating a spring structure on a substrate, the method comprising:

forming a spring metal island on a release material layer, wherein the spring metal island has internal stress variations in the growth direction;

selectively removing a first portion of the release material layer from beneath a free portion of the spring metal island using a release mask that covers an anchor portion of the spring metal island and a portion of the release material layer, where upon removing the first portion of the release material layer, the internal stress variations cause the free portion of the spring metal island to bend relative to the substrate, thereby forming a spring metal finger; and depositing a conductive coating on the free portion of the spring metal finger using a directional deposition process.

2. The method according to claim 1, wherein depositing the conductive coating comprises depositing at least one refractory noble metal.

3. The method according to claim 1, wherein forming the spring metal island comprises depositing at least one of Molybdenum (Mo), Chromium (Cr), and Nickel-Zirconium (NiZr) on an electrically conductive release material layer, and wherein depositing the conductive coating comprises depositing at least one of Rh, Ir, Re, Pt, and Pd.

4. The method according to claim 3, wherein the electrically conductive release material portion comprises at least one metal selected from the group consisting of Ti, Cu, Al, Ni, Zr, and Co.

5. The method according to claim 1, wherein forming the spring metal island comprises:

forming the release material layer using an electrically conducting material;

forming a stress-engineered metal film on the release material layer;

forming a first mask over an elongated region of the stress-engineered metal film; and etching exposed portions of the stress-engineered metal film.

6. The method according to claim 5, wherein selectively removing the first portion of the release material layer further comprises forming the release mask to define a release window exposing the first portion of the release material layer and the free portion of the spring metal island, and wherein the conductive coating is formed on the free portion of the spring metal finger before the release mask is removed.

7. The method according to claim 6, further comprising performing at least one of in-situ ion milling and back sputtering on the free portion of the spring metal finger before depositing the conductive coating.

8. The method according to claim 6, wherein forming the release mask further comprises defining a channel exposing the anchor portion of the spring metal island such that an edge of the anchor portion is covered by the release mask to prevent release of the anchor portion.

9. A method for fabricating a spring structure on a substrate, the method comprising:

etching a spring metal island from a stress-engineered metal film using a first mask, wherein the spring metal island is formed on a release material layer;

removing the first mask;

forming a second mask over a first portion of the spring metal island, wherein a second portion of the spring metal island is exposed through a window formed in the second mask;

selectively removing a portion of the release material layer from beneath the second portion of the spring metal island, where upon removing the portion of the release material layer, the internal stress variations cause the second portion of the spring metal island to bend relative to the substrate, thereby forming a spring metal finger; and depositing a conductive coating on the second portion of the spring metal finger; and removing the second mask.

10. The method according to claim 9, wherein depositing the conductive coating comprises depositing at least one refractory noble metal.

11. The method according to claim 9, wherein forming the spring metal island comprises depositing at least one of Molybdenum (Mo), Chromium (Cr), and Nickel-Zirconium (NiZr) on an electrically conductive release material layer, and wherein depositing the conductive coating comprises depositing at least one of Rh, Ir, Re, Pt, and Pd.

12. The method according to claim 9, wherein selectively removing the first portion of the release material layer further comprises forming the release mask to define a release window exposing the first portion of the release material layer and the free portion of the spring metal island, and wherein the conductive coating is formed on the free portion of the spring metal finger before the release mask is removed.

* * * * *

UNITED STATES PATENT AND TRADEMARK OFFICE
CERTIFICATE OF CORRECTION

| | | |
|---|---|---|
| PATENT NO. | : 6,560,861 B2 | Page 1 of 1 |
| APPLICATION NO. | : 09/904370 | |
| DATED | : May 13, 2003 | |
| INVENTOR(S) | : David K Fork et al. | |

It is certified that error appears in the above-identified patent and that said Letters Patent is hereby corrected as shown below:

Column 1, line 5, insert as a new paragraph:

This invention was made with Government support under 70NANB8H4008 awarded by NIST. The Government has certain rights in this invention.

Signed and Sealed this

Eighteenth Day of March, 2008

JON W. DUDAS
*Director of the United States Patent and Trademark Office*